(12) United States Patent
Muralidharan

(10) Patent No.: US 10,924,075 B2
(45) Date of Patent: Feb. 16, 2021

(54) VARIABLE GAIN AMPLIFIERS WITH OUTPUT PHASE INVARIANCE

(71) Applicant: ANALOG DEVICES, INC., Norwood, MA (US)

(72) Inventor: Sriram Muralidharan, Hillsboro, OR (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 16/037,310

(22) Filed: Jul. 17, 2018

(65) Prior Publication Data

US 2019/0372540 A1 Dec. 5, 2019

Related U.S. Application Data

(60) Provisional application No. 62/680,401, filed on Jun. 4, 2018.

(51) Int. Cl.
*H03G 3/10* (2006.01)
*H03G 3/30* (2006.01)
(Continued)

(52) U.S. Cl.
CPC ......... *H03G 3/3042* (2013.01); *H03F 1/3241* (2013.01); *H03F 3/19* (2013.01);
(Continued)

(58) Field of Classification Search
CPC ........... H03G 3/3042; H03G 2201/307; H03G 2201/103; H03G 3/3047; H03G 3/3036;
(Continued)

(56) References Cited

U.S. PATENT DOCUMENTS 5,365,279 A 11/1994 Harford
5,880,631 A 3/1999 Sahota
(Continued)

FOREIGN PATENT DOCUMENTS

| EP | 1359666 A2 | 11/2003 |
|---|---|---|
| EP | 1359666 A3 | 11/2003 |
| GB | 2474778 A | 4/2011 |

OTHER PUBLICATIONS

Pan et al., "A 50-dB Variable Gain Amplifier Using Parasitic Bipolar Transistors in CMOS" IEEE Journal of Solid-State Circuits, vol. 24, No. 4, Aug. 1989, in 11 pages.
(Continued)

*Primary Examiner* — Khanh V Nguyen
(74) *Attorney, Agent, or Firm* — Knobbe, Martens, Olson & Bear, LLP

(57) ABSTRACT

Variable gain amplifiers (VGA) with output phase invariance are provided herein. In certain embodiments, a VGA is operable in a selected gain setting chosen from multiple gain settings that provide different amounts of amplification to a radio frequency (RF) input signal. The VGA includes a gain transistor that has a substantially constant bias current across the gain settings, such that the VGA's output phase, input impedance matching, and/or input return loss are substantially constant. The gain setting of the VGA is selected by controlling relative biasing of a pair of cascode transistors each connected to the gain transistor by a corresponding degeneration resistor. The degeneration resistors provide compensation that reduces or eliminates a difference in output phase of the VGA across gain settings, for instance, by introducing a zero in a transfer function of the VGA that cancels a pole arising from the cascode transistors.

20 Claims, 9 Drawing Sheets

(51) Int. Cl.
*H03F 1/32* (2006.01)
*H03F 3/19* (2006.01)
*H04B 1/40* (2015.01)

(52) U.S. Cl.
CPC .. *H03F 2200/294* (2013.01); *H03F 2200/451* (2013.01); *H03F 2201/3215* (2013.01); *H03G 3/10* (2013.01); *H03G 2201/103* (2013.01); *H03G 2201/307* (2013.01); *H04B 1/40* (2013.01)

(58) Field of Classification Search
CPC .... H03G 3/001; H03G 1/0088; H03G 1/0023; H03G 1/0052; H03G 1/007; H03G 3/3015; H03G 1/0029; H03G 3/3089; H03G 3/3052; H03F 1/3241; H03F 3/19; H03F 2200/294; H03F 2201/3215; H03F 2200/451; H03F 1/0261; H03F 2203/45264; H03F 2201/3212; H03F 1/22; H04B 1/40
USPC .......................... 330/254, 278, 279, 283, 285
See application file for complete search history.

(56) References Cited

U.S. PATENT DOCUMENTS

| | | | | |
|---|---|---|---|---|
| 5,994,961 | A * | 11/1999 | Lunn | H03F 1/302 330/254 |
| 6,046,640 | A | 4/2000 | Brunner | |
| 6,049,251 | A | 4/2000 | Meyer | |
| 6,211,737 | B1 | 4/2001 | Fong | |
| 6,392,487 | B1 * | 5/2002 | Alexanian | H03G 1/0023 330/254 |
| 6,583,668 | B1 | 6/2003 | Cheh-Ming et al. | |
| 6,690,236 | B2 * | 2/2004 | Saito | H03F 3/45103 327/359 |
| 6,724,235 | B2 | 4/2004 | Costa et al. | |
| 6,791,414 | B2 * | 9/2004 | Trodd | H03G 1/0023 330/254 |
| 6,803,819 | B2 | 10/2004 | Kim | |
| 6,891,405 | B2 | 5/2005 | Fujimura et al. | |
| 7,084,704 | B2 | 8/2006 | Sowlati | |
| 7,164,318 | B2 | 1/2007 | Costa et al. | |
| 7,482,879 | B2 | 1/2009 | Koutani et al. | |
| 7,626,457 | B2 * | 12/2009 | Mudd | H03F 1/26 330/254 |
| 7,667,541 | B2 * | 2/2010 | Okamoto | H03G 1/0088 330/278 |
| 7,705,680 | B2 * | 4/2010 | Igarashi | H03F 1/22 330/278 |
| 7,719,359 | B1 * | 5/2010 | Qian | H03F 3/45475 330/124 R |
| 7,889,008 | B2 * | 2/2011 | Lee | H03G 1/0023 330/278 |
| 8,975,968 | B2 | 3/2015 | Abdelhalem et al. | |
| 9,106,185 | B2 | 8/2015 | Youssef et al. | |
| 9,143,111 | B2 * | 9/2015 | Yoshikawa | H03G 1/0029 |
| 10,243,664 | B2 * | 3/2019 | Nagatani | H03G 3/3084 |
| 10,256,894 | B2 * | 4/2019 | Eitan | H04B 7/086 |
| 2009/0085660 | A1 | 4/2009 | Mudd et al. | |
| 2011/0121881 | A1 | 5/2011 | Feng et al. | |
| 2012/0025911 | A1 | 2/2012 | Zhao et al. | |
| 2017/0187343 | A1 | 6/2017 | Vera Villarroel et al. | |
| 2017/0194911 | A1 | 7/2017 | Aksin | |
| 2017/0310350 | A1 | 10/2017 | Tanaka et al. | |

OTHER PUBLICATIONS

Sadhu et al., "A 28GHz SiGe BiCMOS Phase Invariant VGA" 2016 IEEE Radio Frequency Integrated Circuits Symposium, in 4 pages.
Sadhu et al., Industry Showcase Paper "A 28GHz SiGe BiCMOS Phase Invariant VGA" (2016), in 24 pages.
Tsai et al., "A Novel SiGe BiCMOS Variable-Gain Active Predistorter Using Current Steering Topologies" 2004 IEEE Radio Frequency Integrated Circuits Symposium, in 4 pages.
Xiao et al., "A High Dynamic Range CMOS Variable Gain Amplifier for Mobile DTV Tuner" IEEE Journal of Solid-State Circuits, vol. 42, No. 2, Feb. 2007, in 10 pages.
Li et al, Compact Low-Cost High-Sensitivity CMOS Radar-on-Chip Integration for Security Applications, SPIE dated Dec. 31, 2010 in 10 pages.
Huang et al., A 155-MHz BiCMOS Automatic Gain Control Amplifier, IEEE, Transactions on Circuits and Systems II: Analog and Digital Signal Processing, vol. 46:5 dated May 5, 1999 in 5 pages.
European Search Report from European Application No. EP19175400 dated Sep. 23, 2019 in 8 pgs.
European Communication under Rule 71(3) EPC for European Application No. 19 175 400.1 dated Jun. 10, 2020 in 37 pgs.

\* cited by examiner

VARIABLE GAIN AMPLIFIERS WITH OUTPUT PHASE INVARIANCE

CROSS-REFERENCE TO RELATED APPLICATIONS

The present application claims priority to U.S. Provisional Patent Application No. 62/680,401, filed Jun. 4, 2018, and titled "VARIABLE GAIN AMPLIFIERS," the entirety of which is hereby incorporated herein by reference.

FIELD OF THE DISCLOSURE

Embodiments of the invention relate to electronic systems, and more particularly, to variable gain amplifiers.

BACKGROUND

Variable gain amplifiers (VGAs) are used in a variety of remote sensing and/or communications equipment. For instance, applications ranging from ultrasound, radar, lidar, radio frequency (RF) communications, and/or speech analysis include VGAs for providing gain control to enhance dynamic performance.

In one example, an RF system includes a VGA for providing gain control in a receive path, thereby providing control over the power of signals wirelessly received over an antenna. Including a VGA in a receive path aids in achieving a desired signal level for a given RF operating environment and/or communication distance. In another example, an RF system includes a VGA for providing gain control in a transmit path, thereby providing power control of wireless transmissions.

SUMMARY OF THE DISCLOSURE

Figure 1:
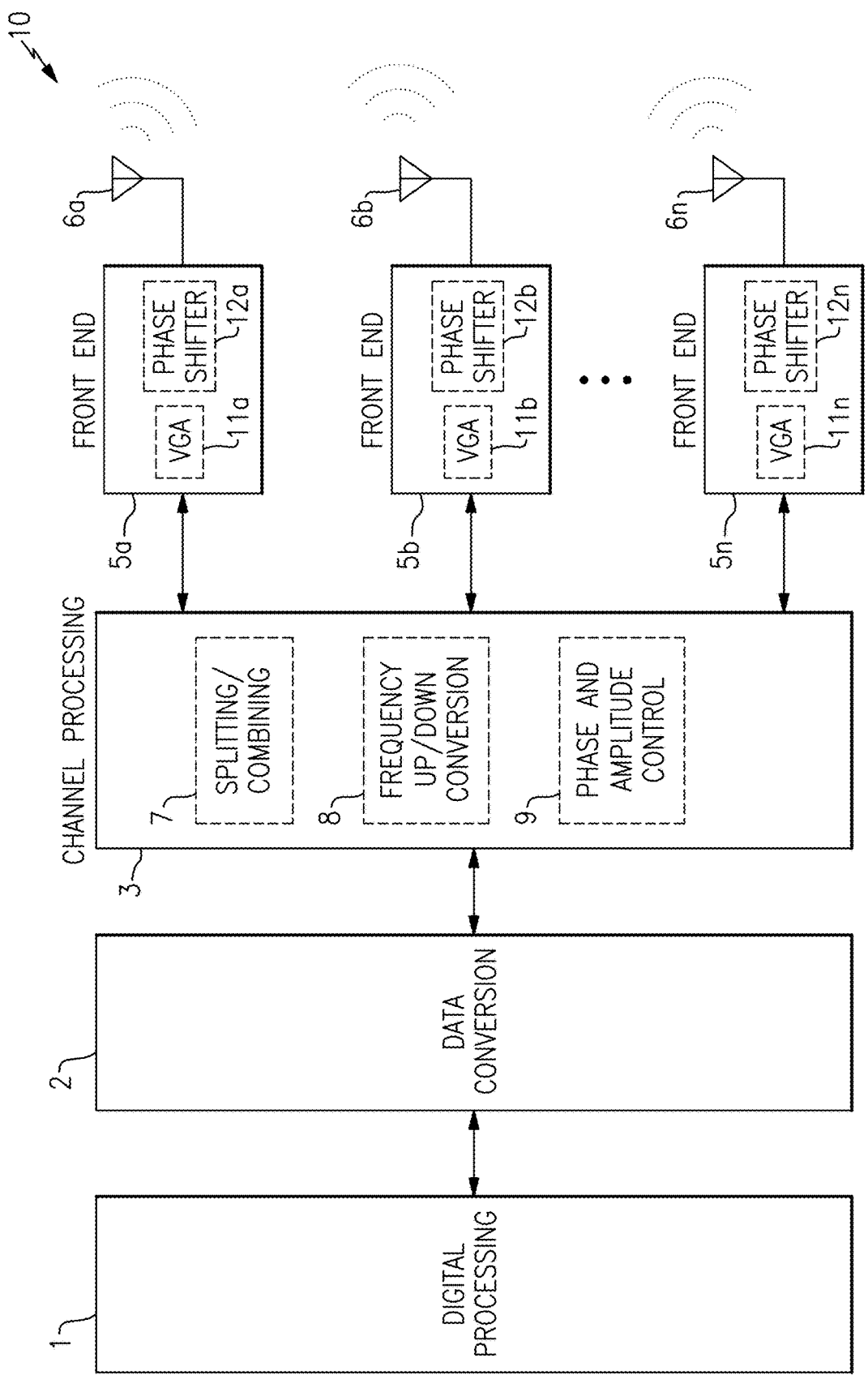
FIG. 1 is a schematic diagram of one embodiment of a phased array antenna system including variable gain amplifiers (VGAs).

Variable gain amplifiers (VGA) with output phase invariance are provided herein. In certain embodiments, a VGA is operable in a selected gain setting chosen from multiple gain settings that provide different amounts of amplification to a radio frequency (RF) input signal. The VGA includes a gain transistor that has a substantially constant bias current across the gain settings, such that the VGA's output phase, input impedance matching, and/or input return loss are substantially constant. The gain setting of the VGA is selected by controlling relative biasing of a pair of cascode transistors each connected to the gain transistor by a corresponding degeneration resistor. The degeneration resistors provide compensation that reduces or eliminates a difference in output phase of the VGA across gain settings, for instance, by introducing a zero in a transfer function of the VGA that cancels a pole arising from the cascode transistors.

In one aspect, a VGA includes a gain transistor configured to generate a signal current based on amplifying a radio frequency (RF) input signal received from an input terminal, a first degeneration resistor and a second degeneration resistor, an output cascode transistor electrically connected in series with the first degeneration resistor between an output terminal and the gain transistor, a shunt cascode transistor electrically connected in series with the second degeneration resistor between a DC voltage and the gain transistor, and a gain control circuit configured to control a gain setting of the VGA by biasing the output cascode transistor and the shunt cascode transistor to control a proportion of the signal current that flows through the output cascode transistor relative to the shunt cascode transistor.

In another aspect, an RF system includes a controllable phase shifter and a VGA electrically connected in a signal path with the controllable phase shifter. The VGA includes a gain transistor configured to amplify an RF signal received from an input terminal, a first degeneration resistor and a second degeneration resistor, an output cascode transistor electrically connected in series with the first degeneration resistor between an output terminal and the gain transistor, a shunt cascode transistor electrically connected in series with the second degeneration resistor between a DC voltage and the gain transistor, and a gain control circuit configured to control a gain setting of the VGA by biasing the output cascode transistor and the shunt cascode transistor.

In another aspect, a VGA includes a gain transistor configured to amplify a radio frequency (RF) input signal received from an input terminal, an output cascode transistor electrically connected between an output terminal and the gain transistor, a shunt cascode transistor electrically connected between a DC voltage and the gain transistor, and a gain control circuit configured to bias the output cascode transistor and the shunt cascode transistor to operate the VGA is a selected gain setting chosen from a plurality of gain settings that provide a gain range of at least 20 dB. A variation in output phase at the output terminal is less than 5 degrees over the gain range.

DETAILED DESCRIPTION OF EMBODIMENTS

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Variable gain amplifiers (VGAs) with output phase invariance are provided herein. In certain embodiments, a VGA includes a gain transistor that amplifies an RF input signal received from an input terminal to generate a signal current, an output cascode transistor electrically connected in series with a first degeneration resistor between an output terminal and the gain transistor, a shunt cascode transistor electrically connected in series with a second degeneration resistor between a DC voltage and the gain transistor, and a gain control circuit that controls a gain setting of the VGA by biasing the output cascode transistor and the shunt cascode transistor to control a proportion of the signal current that flows through the output cascode transistor relative to the shunt cascode transistor.

The degeneration resistors operate to provide phase invariance, thereby reducing or eliminating a difference in output phase of the VGA across gain settings. For example, including the degeneration resistors introduces a zero in a transfer function of the VGA, which cancels a pole arising from the cascode transistors. Thus, the transfer function zero provides cancellation of the transfer function pole to provide phase invariance.

In certain implementations, the bias current of the gain transistor is substantially constant across gain settings. By implementing the VGA in this manner, the input impedance of the gain transistor is substantially independent of gain setting, which maintains a phase delay through the gain transistor substantially constant. Moreover, by providing a substantially constant bias current across gain settings, input impedance matching and/or input return loss (S11) are substantially independent of gain setting.

In contrast, conventional VGAs suffer from a number of drawbacks. For example, VGAs that have a bias current that changes with gain setting can suffer from input impedance variations and/or transconductance variation as the gain setting is changed. This in turn can lead to variation in input return loss and undesirable loading of other RF circuitry in the signal chain. Furthermore, certain VGAs are implemented with linearization techniques that limit gain range and/or that result in higher power and area to achieve a desired range of gain.

FIG. 1 is a schematic diagram of one embodiment of a phased array antenna system 10 including variable gain amplifiers (VGAs). The phased array antenna system 10 includes a digital processing circuit 1, a data conversion circuit 2, a channel processing circuit 3, RF front ends 5a, 5b, . . . 5n, and antennas 6a, 6b, . . . 6n. Although an example with three RF front ends and three antennas is illustrated, the phased array antenna system 10 can include more or fewer RF front ends and/or more or fewer antennas as indicated by the ellipses. Furthermore, in certain implementations, the phased array antenna system 10 is implemented with separate antennas for transmitting and receiving signals.

The phased array antenna system 10 illustrates one embodiment of an electronic system that can include one or more VGAs implemented in accordance with the teachings herein. However, the VGAs disclosed herein can be used in a wide range of electronics. A phased array antenna system is also referred to herein as an active scanned electronically steered array.

As shown in FIG. 1, the channel processing circuit 3 is coupled to antennas 6a, 6b, . . . 6n through RF front ends 5a, 5b, . . . 5n, respectively. The channel processing circuit 3 includes a splitting/combining circuit 7, a frequency up/down conversion circuit 8, and a phase and amplitude control circuit 9, in this embodiment. The channel processing circuit 3 provides RF signal processing of RF signals transmitted by and received from each communication channel. In the illustrated embodiment, each communication channel is associated with a corresponding RF front end and antenna.

With continuing reference to FIG. 1, the digital processing circuit 1 generates digital transmit data for controlling a transmit beam radiated from the antennas 6a, 6b, . . . 6n. The digital processing circuit 1 also processes digital receive data representing a receive beam. In certain implementations, the digital processing circuit 1 includes one or more baseband processors.

As shown in FIG. 1, the digital processing circuit 1 is coupled to the data conversion circuit 2, which includes digital-to-analog converter (DAC) circuitry for converting digital transmit data to one or more baseband transmit signals and analog-to-digital converter (ADC) circuitry for converting one or more baseband receive signals to digital receive data.

The frequency up/down conversion circuit 8 provides frequency upshifting from baseband to RF and frequency downshifting from RF to baseband, in this embodiment. However, other implementations are possible, such as configurations in which the phased array antenna system 10 operates in part at an intermediate frequency (IF). In certain implementations, the splitting/combining circuit 7 provides splitting to one or more frequency upshifted transmit signals to generate RF signals suitable for processing by the RF front ends 5a, 5b, . . . 5n and subsequent transmission on the antennas 6a, 6b, . . . 6n. Additionally, the splitting/combining circuit 7 combines RF signals received vias the antennas 6a, 6b, . . . 6n and RF front ends 5a, 5b, . . . 5n to generate one or more baseband receive signals for the data conversion circuit 2.

The channel processing circuit 3 also includes the phase and amplitude control circuit 9 for controlling beamforming operations. For example, the phase and amplitude control circuit 9 controls the amplitudes and phases of RF signals transmitted or received via the antennas 6a, 6b, . . . 6n to provide beamforming. With respect to signal transmission, the RF signal waves radiated from the antennas 6a, 6b, . . . 6n aggregate through constructive and destructive interference to collectively generate a transmit beam having a particular direction. With respect to signal reception, the channel processing circuit 3 generates a receive beam by combining the RF signals received from the antennas 6a, 6b, . . . 6n after amplitude scaling and phase shifting.

Phased array antenna systems are used in a wide variety of applications including, but not limited to, mobile communications, military and defense systems, and/or radar technology.

As shown in FIG. 1, the RF front ends 5a, 5b, . . . 5n each include one or more VGAs 11a, 11b, . . . 11n, which are used to scale the amplitude of RF signals transmitted or received by the antennas 6a, 6b, . . . 6n, respectively. Additionally, the RF front ends 5a, 5b, . . . 5n each include one or more phase shifters 12a, 12b, . . . 12n for phase-shifting the RF signals. For example, in certain implementations the phase and amplitude control circuit 9 generates gain control signals for controlling the amount of gain provided by the VGAs 11a, 11, . . . 11n and phase control signals for controlling the amount of phase shifting provided by the phase shifters 12a, 12b, . . . 12n.

The phased array antenna system 10 operates to generate a transmit beam or receive beam including a main lobe pointed in a desired direction of communication. The phased array antenna system 10 realizes increased signal to noise (SNR) ratio in the direction of the main lobe. The transmit or receive beam also includes one or more side lobes, which point in different directions than the main lobe and are undesirable.

An accuracy of beam direction of the phased array antenna system 10 is based on a precision in controlling the phases of the RF signals communicated via the antennas 6a, 6b, . . . 6n. For example, when one or more of the RF signals has a large phase error, the beam can be broken and/or pointed in an incorrect direction. Furthermore, the size or magnitude of beam side lobe levels is based on an accuracy in controlling the amplitude of the RF signals.

Accordingly, it is desirable to tightly control the phase and amplitude of RF signals communicated by the antennas 6a, 6b, . . . 6n to provide robust beamforming operations.

By implementing the VGAs 11a, 11b, . . . 11n in accordance with the teachings herein, beamforming operations of the phased array antenna system 10 are enhanced by providing tighter control over phase of RF signals. For example, the VGAs 11a, 11b, . . . 11n can exhibit phase invariance across different gain settings, and thus the gain setting of the VGAs can be changed as desired with little to no impact on output phase. Thus, the controllable phase shifters 12a, 12b, . . . 12n can provide desired phase shifts to RF signals substantially independent of the selected gain settings of the VGAs 11a, 11b, . . . 11n. Moreover, the VGAs herein operate with a relatively wide gain range and good gain step characteristics, and thus are suitable for providing gain control in phased array antenna systems as well as other applications.

Figure 2A:
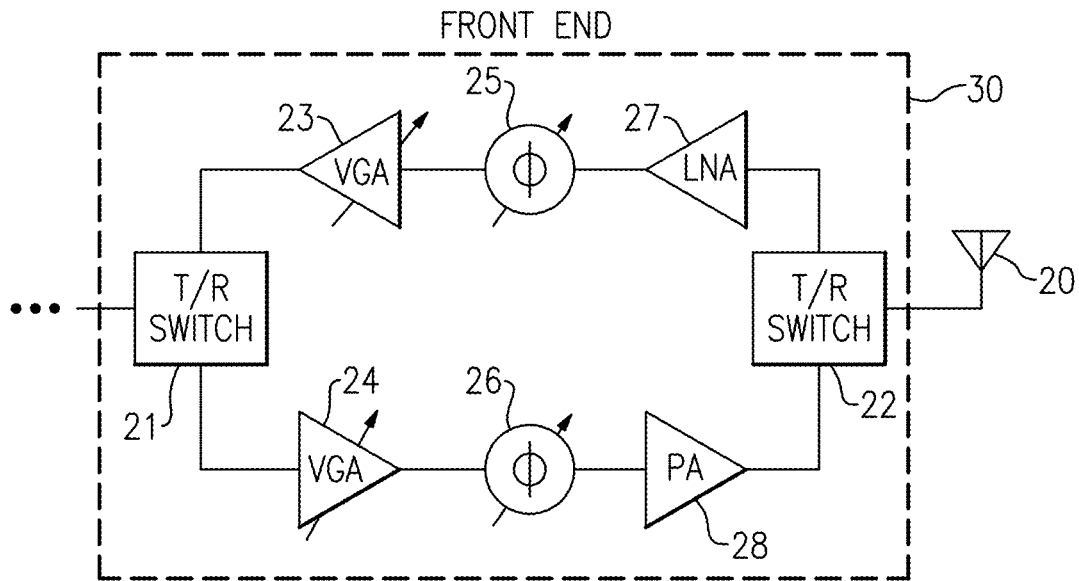
FIG. 2A is a schematic diagram of one embodiment of a front end system including VGAs.

FIG. 2A is a schematic diagram of one embodiment of a front end system 30 including VGAs. The front end system 30 includes a first transmit/receive (T/R) switch 21, a second transmit/receive switch 22, a receive-path VGA 23, a transmit-path VGA 24, a receive-path controllable phase shifter 25, a transmit-path phase shifter 26, a low noise amplifier (LNA) 27, and a power amplifier (PA) 28. As shown in FIG. 2A, the front end system 30 is depicted as being coupled to the antenna 20.

The front end system 30 can be included in a wide variety of RF systems, including, but not limited to, phased array antenna systems, such as phased array antenna system 10 of FIG. 1. For example, multiple instantiations of the front end system 30 can be used to implement the RF front ends 5a, 5b, . . . 5n of FIG. 1. In certain implementations, one or more instantiations of the front end system 30 are fabricated on a semiconductor die or chip.

As shown in FIG. 2A, the front end system 30 includes the receive-path VGA 23 for controlling an amount of amplification provided to an RF input signal received on the antenna 20, and the transmit-path VGA 24 for controlling an amount of amplification provided to an RF output signal transmitted on the antenna 20. The gain control provided by the VGAs can serve a wide variety of purposes including, but not limited to, compensating for temperature and/or process variation. Moreover, in beamforming applications, the VGAs can control side-lobe levels of a beam pattern.

RF systems, such as the front end system 30 of FIG. 2A, can include one or more VGAs for controlling the gain provided to RF signals propagating along transmit paths and/or receive paths. Although one example of an RF system including VGAs is shown, the teachings herein are applicable to RF systems implemented in a wide variety of ways.

It is desirable for a VGA to have a substantially constant phase delay from input to output as the gain setting of the VGA changes. In the absence of phase invariance of the VGA, the phase of the RF signal outputted from the VGA can change unpredictably.

Output phase invariance can be particularly important in beamforming applications, such as phased array antenna systems. For example, the front end system 30 of FIG. 2A can correspond to a channel of a phased array antenna system, and multiple instantiations of the RF system can be included to serve as channels for beamforming. Additionally, a direction of a transmit beam or a receive beam in such a phased array antenna system is steered by modifying the phase difference between the multiple channels, and the side-lobe levels are adjusted by modifying the amplitude among the channels.

It is desirable that while changing VGA gain, the phase delay remains substantially constant at a given frequency such that the channel's phase is set by the phase shifter. Although calibration can be used provide some compensation for the VGA's phase variation due to gain control, such calibration schemes can be cumbersome and/or not fully compensate for the phase variation. Furthermore, excessive phase variation can lead to beam steering in an undesired direction, inability to form a beam, and/or undesired levels of beam side-lobes.

Figure 2B:
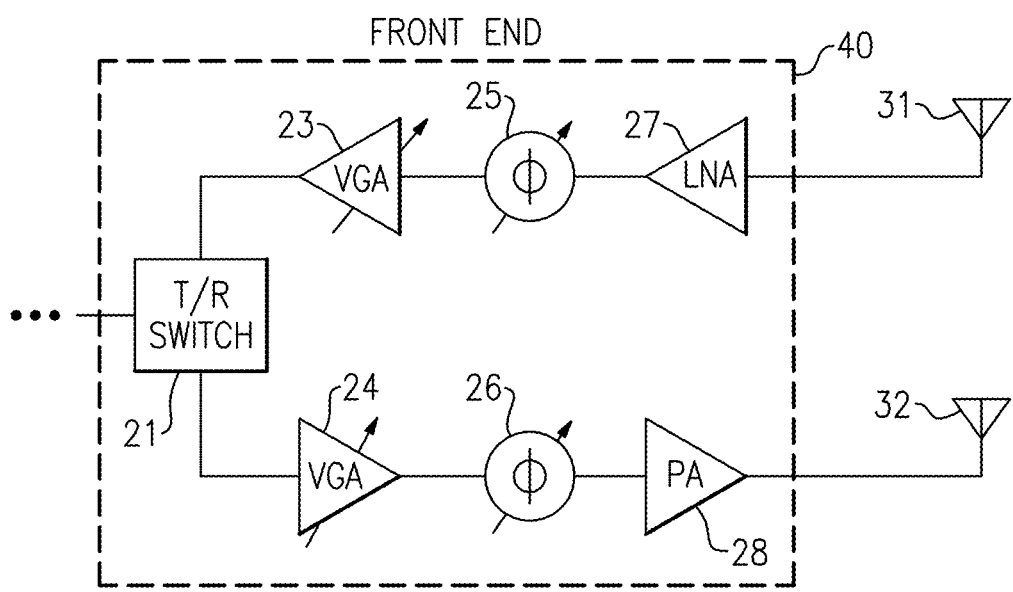
FIG. 2B is a schematic diagram of another embodiment of a front end system including VGAs.

FIG. 2B is a schematic diagram of another embodiment of a front end system 40 including VGAs. The front end system 40 of FIG. 2B is similar to the front end system 30 of FIG. 2A, except that the front end system 40 omits the second transmit/receive switch 22. As shown in FIG. 2B, the front end system 40 is depicted as being coupled to a receive antenna 31 and to a transmit antenna 32.

The front end system 40 operates with different antennas for signal transmission and reception. In the illustrated embodiment, the receive-path VGA 23 controls an amount of amplification provided to an RF input signal received on the receive antenna 31, and the transmit-path VGA 24 controls an amount of amplification provided to an RF output signal transmitted on the second antenna 32.

Certain RF systems include separate antennas for transmission and reception of signals.

Figure 3:
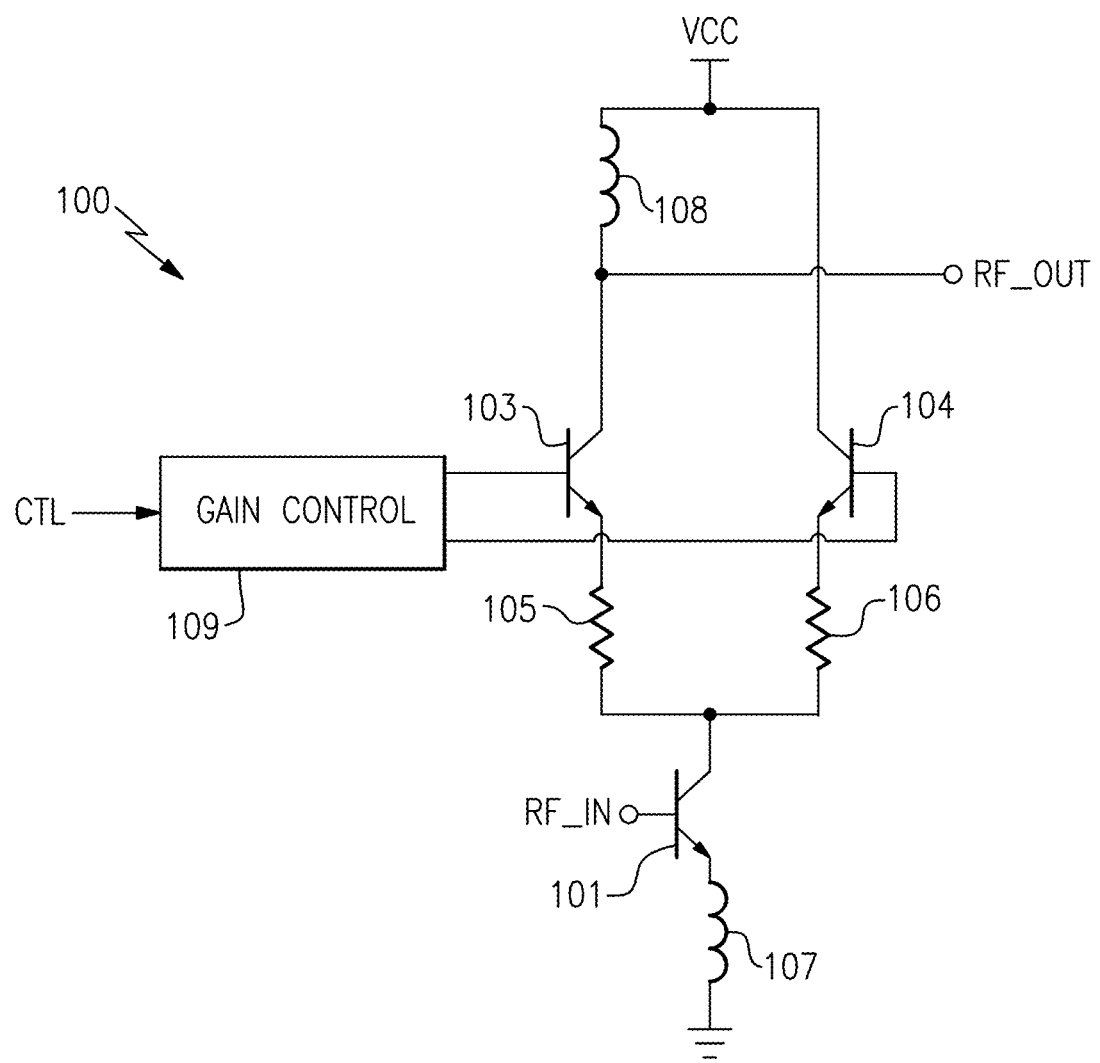
FIG. 3 is a schematic diagram of a VGA according to one embodiment.

FIG. 3 is a schematic diagram of a VGA 100 according to one embodiment. The VGA 100 includes a gain transistor 101, an output cascode transistor 103, a shunt cascode transistor 104, a first degeneration resistor 105, a second degeneration resistor 106, a degeneration inductor 107, an output matching inductor 108, and a gain control circuit 109.

Although an implementation with bipolar transistors is shown, the VGA 100 can also be implemented using field-effect transistors (FETs) or a combination of bipolar transistors and FETs.

The gain transistor 101 provides amplification to an RF input signal (RF_IN). Additionally, a portion of the signal current generated at the collector of the gain transistor 101 flows through the first degeneration resistor 105 and the output cascode transistor 103 to generate an RF output signal (RF_OUT).

Including the degeneration resistors 105-106 introduces a zero in a transfer function of the VGA 100, which cancels a pole arising from the cascode transistors 103-104. In particular, the transfer function zero provides cancellation of the transfer function pole to thereby compensate for variation in output phase.

As shown in FIG. 3, the gain control circuit 109 controls a gain of the VGA 100 by controlling the proportion of signal current from the gain transistor 101 that is steered into the output cascode transistor 103 relative to the shunt cascode transistor 104. Thus, a difference in bias voltage between the output cascode transistor 103 and the shunt cascode transistor 104 controls the gain of the VGA 100.

The gain setting provided by the gain control circuit 109 corresponds to a selected gain setting chosen from multiple gain settings that provide different amounts of amplification to the RF input signal (RF_IN). The selected gain setting can be based on one or more analog and/or digital control signals (CTL) to the gain control circuit. In certain implementations, one or more instantiations of the VGA 100 are fabricated on a semiconductor die or chip that includes an interface that receives digital data indicating the desired gain setting. Additionally, the gain control circuit 109 processes the digital data to generate bias signals for the cascode transistors 103-104 corresponding to the desired gain setting.

The VGA 100 has a number of advantages relative to certain conventional VGAs, including that the bias current through the gain transistor 101 is substantially constant across gain settings.

By maintaining the bias current substantially constant across gain settings, the input impedance of the gain transistor 101 is substantially independent of the gain setting. This in turn leads to a substantially constant phase delay through the gain transistor 101 and substantially the same input return loss ($S_{11}$) and input impedance matching. Furthermore, the degeneration resistors 105-106 aid in maintaining constant phase shift for different gain settings.

In contrast, conventional VGAs can suffer from a number of drawbacks. For example, VGAs that have a bias current that changes with gain setting can suffer from input impedance variations (for instance, change in base charge capacitance or $C_\pi$ of a polar transistor) and/or transconductance variation across gain settings. This in turn can lead to change in input return loss and undesirable loading of other RF circuitry in the signal chain. Furthermore, certain VGAs are implemented with linearization techniques, such as degeneration of gain transistors, which results in limited gain range and/or higher power and area to achieve a desired gain control range.

The resistance of the degeneration resistors 105-106 can be chosen based on a variety of factors, including, but not limited to, constraints on available voltage headroom and/or an amount of current flow through the cascode transistors 103-104. In one embodiment, the resistance of each degeneration resistor is between about 3 Ohms and about 20 Ohms.

In certain implementations herein, the VGA 100 is implemented to achieve less than 5 degrees of output phase variation for a gain range of 20 dB. Additionally or alternatively, in some implementations herein the VGA 100 is implemented to have an input return loss of less than −10 dB (or more particularly, less than −15 dB) over a gain range of 20 dB.

Figure 4:
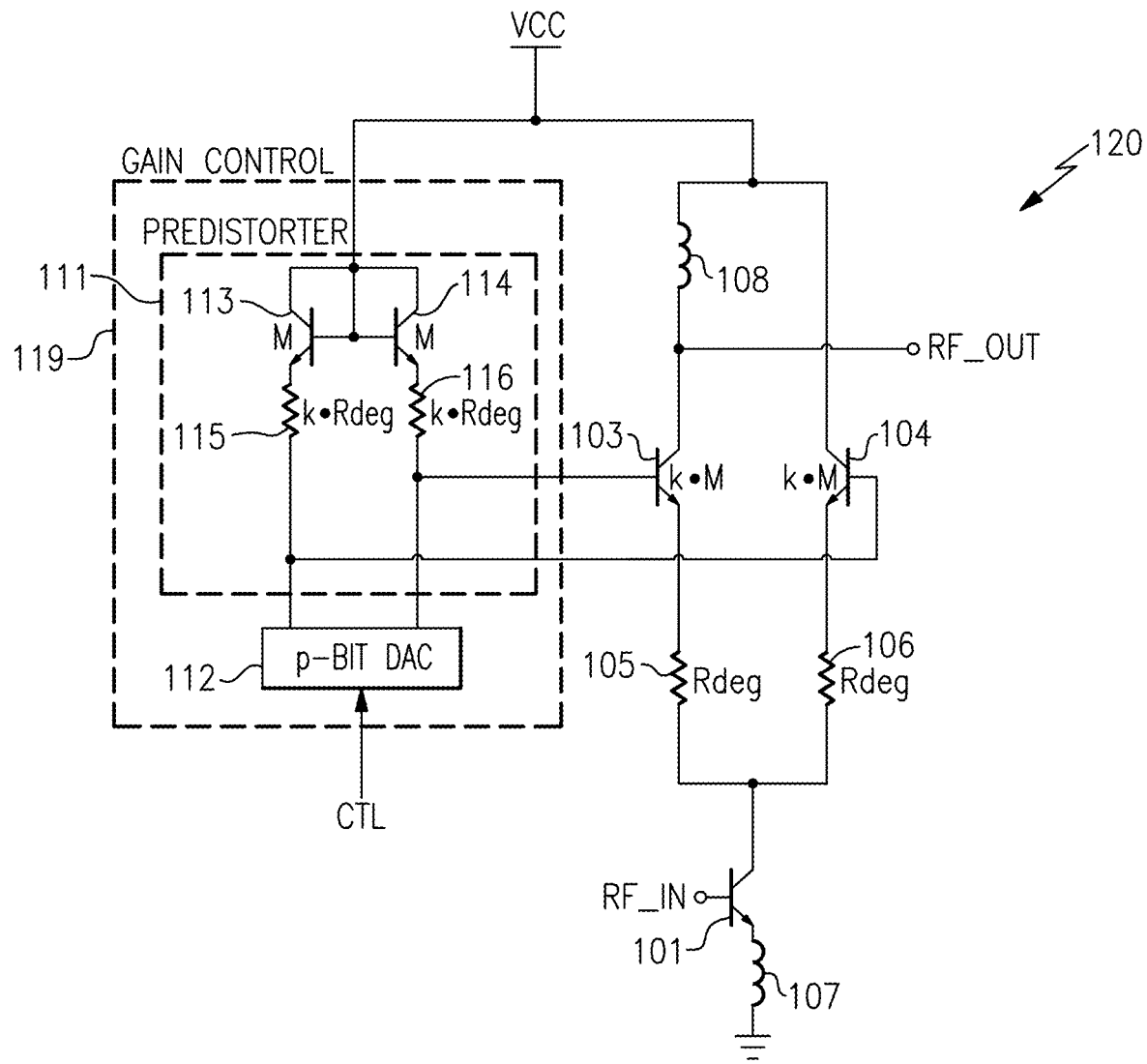
FIG. 4 is a schematic diagram of a VGA according to another embodiment.

FIG. 4 is a schematic diagram of a VGA 120 according to another embodiment. The VGA 120 of FIG. 4 is similar to the VGA 100 of FIG. 3, except that the VGA 120 of FIG. 4 illustrates a specific implementation of the gain control circuit 109 of FIG. 3.

In particular, the gain control circuit 119 of FIG. 4 includes a current DAC 112 and a predistorter circuit 111 for providing enhanced linearity to the gain settings. Including the predistorter circuit 111 provides the VGA 120 with gain settings that are spaced apart relatively evenly with respect to gain value.

In the illustrated embodiment, the predistorter circuit 111 includes predistorter transistors 113-114 that are a factor of k smaller than the cascode transistors 103-104, and predistorter resistors 115-116 that are a factor of k greater than the degeneration resistors 105-106. In one example, the transistors 113-114 have a width of about M, the transistors 103-104 have a width of about k*M, the resistors 115-116 have a resistance of about k*Rdeg, and the resistors 105-106 have a resistance of about Rdeg.

The factor of k can have suitable value. In one embodiment, k is selected to be in the range of 5 to 10. However, other values of k are possible, For example, higher k reduces power consumption of the predistorter circuit 111 by reducing total current of the transistors 113-114, while lower k achieves better device matching between the transistor 113-114 and the transistors 103-104.

The DAC 112 controls the voltage difference between the bases of the cascode transistors, thereby providing gain control. In the illustrated embodiment, the DAC 112 operates with p bits. In certain implementations p is selected to between 4 and 10, for instance, 7 bits. However, the DAC 112 can operate with any suitable number of bits.

The gain transistor 101 operates as a voltage-to-current (V-to-I) stage, which is also referred to herein as a transconductance ($g_m$) stage. For example, the gain transistor 101 is implemented as a common-emitter amplifier stage. In another embodiment, field-effect transistors, such as metal oxide semiconductor (MOS) transistors are used, and a common-source amplifier stage serves to provide V-to-I conversion.

The DC current of the gain transistor 101 is relatively constant. For example, in one embodiment the gain transistor 101 is biased by a current mirror arrangement using a reference current that is substantially constant across gain settings of the VGA 120. In another embodiment, the gain transistor 101 is biased by a base bias that is substantially independent of gain setting.

By using a substantially constant DC current, the transconductance of the gain transistor 101 is about the same for each gain setting to thereby maintain input impedance and return loss substantially constant across gain settings.

The degeneration inductor 107 is coupled to the emitter of the gain transistor 101. The inductor 107 can serve to provide degeneration, thereby linearizing operation of the VGA 120. Additionally or alternatively, the inductor 107 serves to realize a real input impedance for ease of matching to 50 Ohms or another desired system impedance. In another embodiment, the inductor 107 is omitted. In another embodiment, a degeneration resistor or a combination of a degeneration resistor and a degeneration inductor are used for providing linearization.

As shown in FIG. 4, the gain transistor 101 is followed by a pair of cascode transistors (the output cascode transistor 103 and the shunt cascode transistor 104) arranged as a differential pair. Additionally, the output cascode transistor 103 is connected to the output terminal and to a matching network (implemented as the output matching inductor 108, in this embodiment) whereas the shunt cascode transistor 104 is connected to the supply voltage.

The gain control operation of the VGA 120 is performed by varying the voltage difference ($\Delta V_{BE}$) across the bases of the pair of cascode transistors 103-104. For example, when a current 'I' flows through the gain transistor 101, a current 'xI' can flow through the output cascode transistor 103 and a current 'I-xI' can flow through the shunt cascode transistor 104, with x varying between 0 and 1. In one example, a gain range of the VGA 120 is set by limiting a value of x to a range, for instance, between 0.2 and 0.9 where a value of 0.9 indicates high gain setting and a value of 0.2 indicates a low gain setting. However, other implementations are possible.

Absent inclusion of the degeneration resistors 105-106, the asymmetry in the current ranges in the output cascode transistor 103 and the shunt cascode transistor 104 leads to an undesirable effect in terms of output phase. For example, as the current is shifted from the output cascode transistor 103 to the shunt cascode transistor 104 or vice versa, a total $C_\pi$ of both transistors (which is present at the emitters of the transistors) varies and is asymmetric due to the asymmetry in current. Absent compensation, the phase of the signal from the input terminal to the output terminal changes as the gain is varied.

The phase invariance is exacerbated in the presence of parasitic effects, such as parasitic base resistance. For example, any base resistance manifests as inductance in the emitter of the bipolar transistors, which leads to a frequency dependent phase shift in addition to the phase shift due to asymmetry in $C_\pi$.

By including the degeneration resistors 105-106, the amount of phase shift across gain setting is reduced or eliminated. For example, the degeneration resistors 105-106 inhibit phase shift by serving to de-Q the capacitance $C_\pi$ and/or by introducing a pole to cancel the frequency dependent phase shift of base resistance. The degeneration resistors 105-106 are explicit resistors, rather than mere parasitic resistance of the bipolar transistors 103-104.

In certain implementations, the gain range of the VGA 120 depends mainly on the current range of the DAC 112. For example, since the degeneration resistors 105-106 are merely scaled, the linearity of the pair of cascode transistors 103-104 has little to no impact on gain range. Hence, a gain range of 20 dB or more can be achieved from a single stage of the VGA 120, thereby reducing power consumption and area relative to an implementation including two or more low gain stages in series.

In the illustrated embodiment, the bipolar transistors 113-114 of the scaled predistorter circuit 111 are scaled down in size relative to the bipolar transistors 103-104, which provides the benefit of reduced current consumption. The desired gain range and resolution can be achieved by DAC 112. The highest gain is achieved when the current from the gain transistor 101 is steered to the output terminal by turning ON the output cascode transistor 103 whereas the lowest gain is achieved when the current from the gain transistor 101 is steered to the supply voltage by turning ON the shunt cascode transistor 104.

The gain setting of the VGA 120 can be controlled in a wide variety of ways. In certain implementations, digital control data is received by the current DAC over an interface, such as a serial bus. Additionally, the digital data is used by the current DAC to select a particular gain setting.

Figure 5:
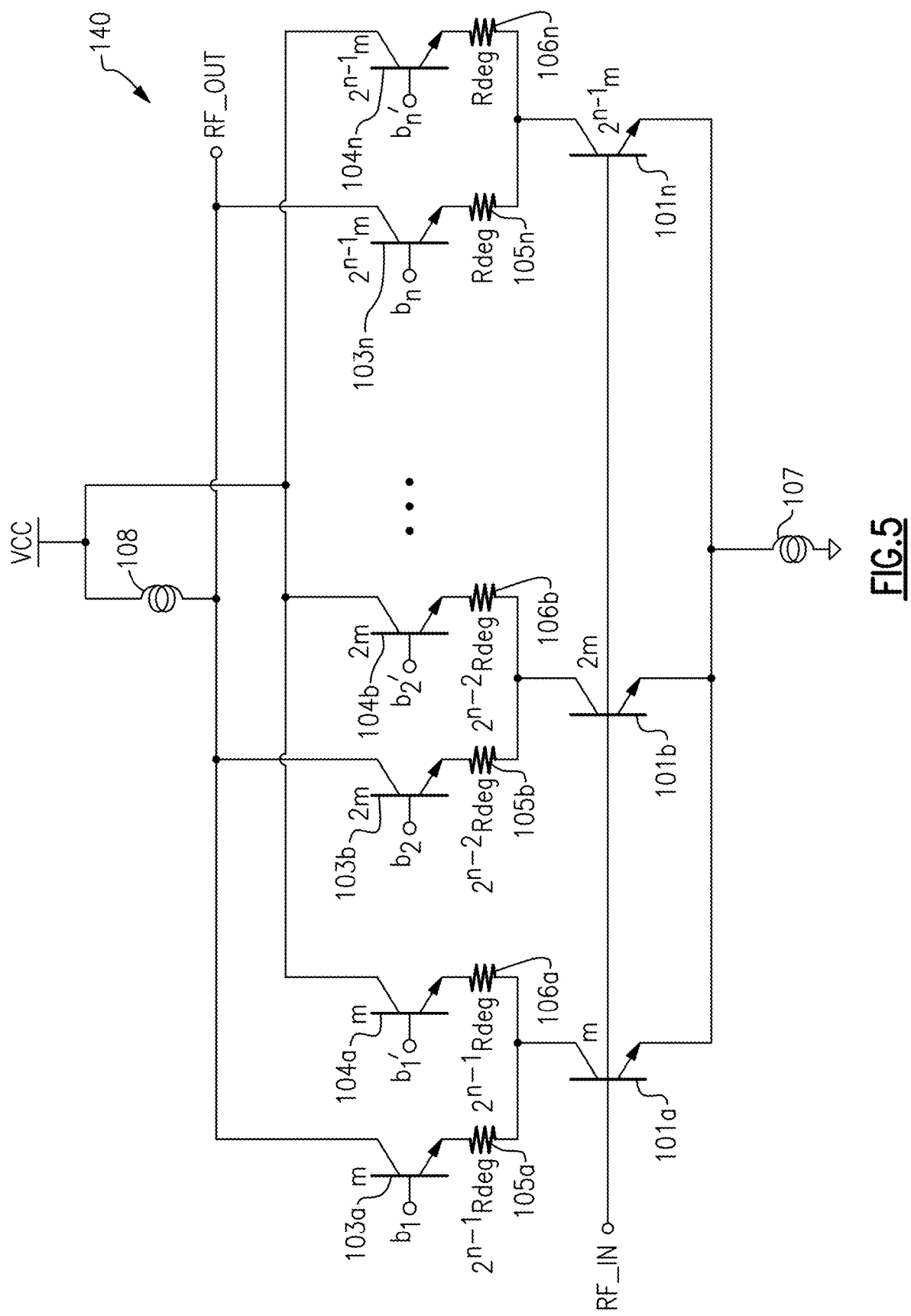
FIG. 5 is a schematic diagram of a VGA according to another embodiment.

FIG. 5 is a schematic diagram of a VGA 140 according to another embodiment. The VGA 140 includes weighted gain transistors 101a, 101b, . . . 101n, weighted output cascode transistors 103a, 103b, . . . 103n, weighted shunt cascode transistors 104a, 104b, . . . 104n, weighted first degeneration resistors 105a, 105b, . . . 105n, weighted second degeneration resistors 106a, 106b, . . . 106n, a degeneration inductor 107, and an output matching inductor 108.

Although three gain transistors, three pairs of cascode transistors, and three pairs of degeneration resistors are included, more or fewer components can be included as indicated by the ellipses.

In the illustrated embodiment, the VGA 140 is implemented using n sections implemented with a power of two weighting. Although an example with power of two weighting is shown, any desired weighting scheme can be used.

The number of sections n can be any suitable value. In one example, n is selected to be in the range of 2 and 10.

As shown in FIG. 5, the RF output signal (RF_OUT) is generated based on a sum of currents from the weighted output cascode transistors 103a, 103b, . . . 103n. Additionally, the biases of the weighted output cascode transistors 103a, 103b, . . . 103n are controlled by a first group of control signals $b_1, b_2, \ldots b_n$, respectively, and the biases of the weighted shunt cascode transistors 104a, 104b, . . . 104n are controlled by a second group of control signals $b_1', b_2', \ldots b_n'$, respectively. In certain implementations, a gain control circuit (not illustrated in FIG. 5) generates the first and second group of control signals to thereby provide a desired gain setting.

In certain implementations, the first group of control signals $b_1, b_2, \ldots b_n$ and the second group of control signals $b_1', b_2', \ldots b_n'$ are digital signals, with the second group of control signals $b_1', b_2', \ldots b_n'$ being logically inverted with respect to the first group of control signals $b_1, b_2, \ldots b_n$. For example, each pair of cascode transistors can be controlled by complementary controls bits to thereby steer current through one transistor or the other of the pair. In other implementations, the first group of control signals $b_1, b_2, \ldots b_n$ and the second group of control signals $b_1', b_2', \ldots b_n'$ are analog signals. For example, the voltage difference can vary from pair to pair to achieve the desired gain setting.

Figure 6:
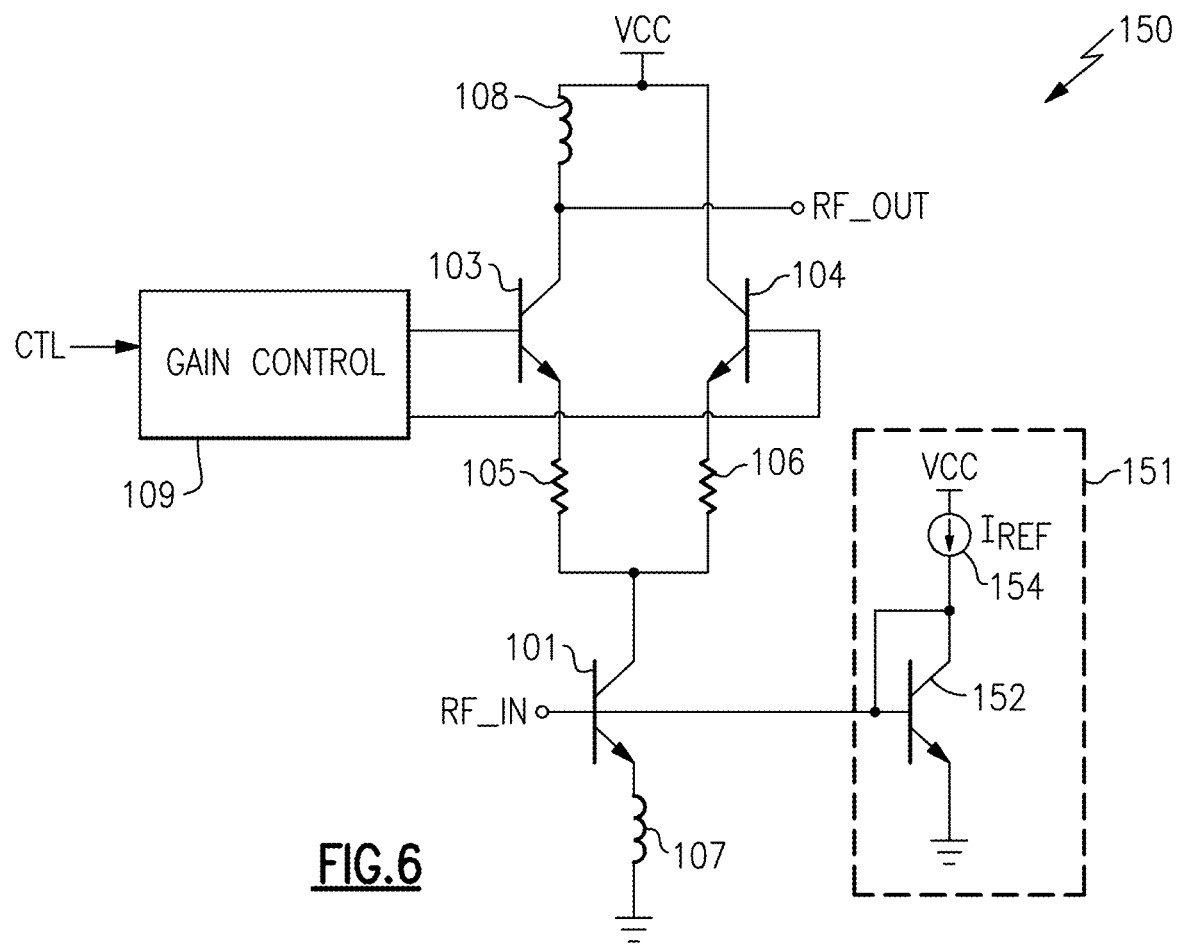
FIG. 6 is a schematic diagram of a VGA according to another embodiment.

FIG. 6 is a schematic diagram of a VGA 150 according to another embodiment. The VGA 150 of FIG. 6 is similar to the VGA 100 of FIG. 3, except that the VGA 150 further includes a bias circuit 151.

The bias circuit 151 includes a current mirror transistor 152 and a reference current source 154 that provides a current $I_{REF}$. In certain implementations, the current $I_{REF}$ is compensated (for example, digitally trimmed) for process variation.

The gain transistor 101 of the VGA 150 operates with a bias current that is substantially constant across different gain settings of the VGA 150. Implementing the VGA 150 in this manner results in the input impedance of the gain transistor 101 being substantially independent of the gain setting, which in turn aids in achieving a substantially constant phase delay through the gain transistor 101 and maintaining input impedance matching and input return loss substantially the same.

Figure 7:
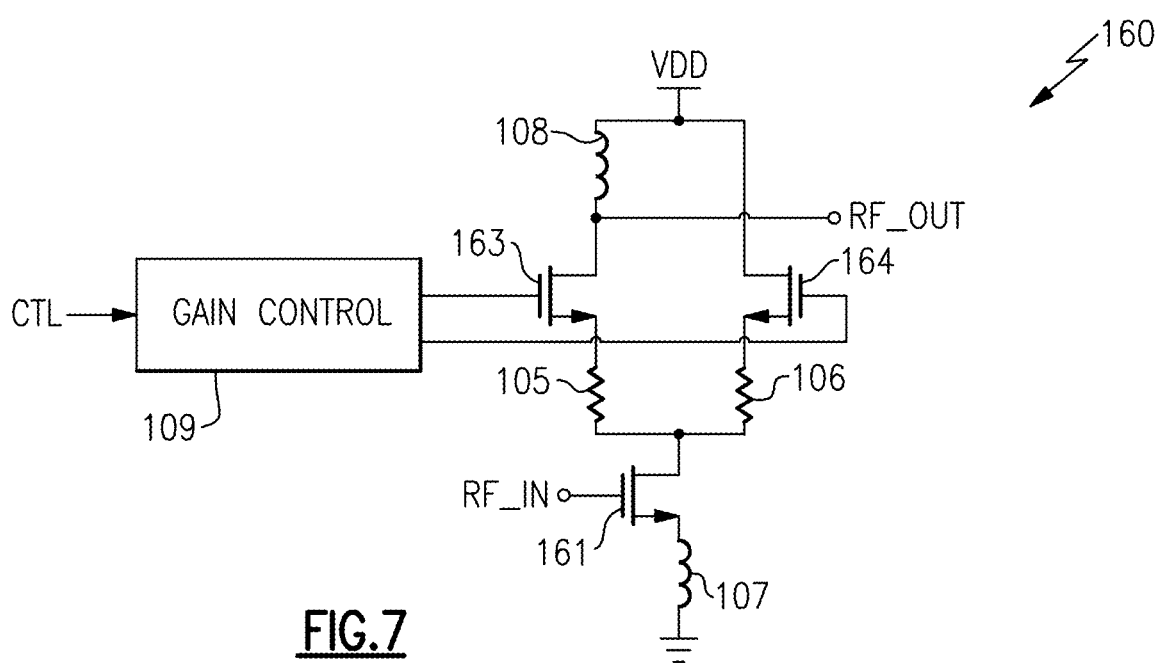
FIG. 7 is a schematic diagram of a VGA according to another embodiment.

FIG. 7 is a schematic diagram of a VGA 160 according to another embodiment. The VGA 160 includes a gain transistor 161, an output cascode transistor 163, a shunt cascode transistor 164, a first degeneration resistor 105, a second degeneration resistor 106, a degeneration inductor 107, an output matching inductor 108, and a gain control circuit 109.

The VGA 160 of FIG. 7 is similar to the VGA 100 of FIG. 3, except that the VGA 160 is implemented with FETs rather than bipolar transistors. In certain implementations, the FETs correspond to MOS transistors.

Figure 8:
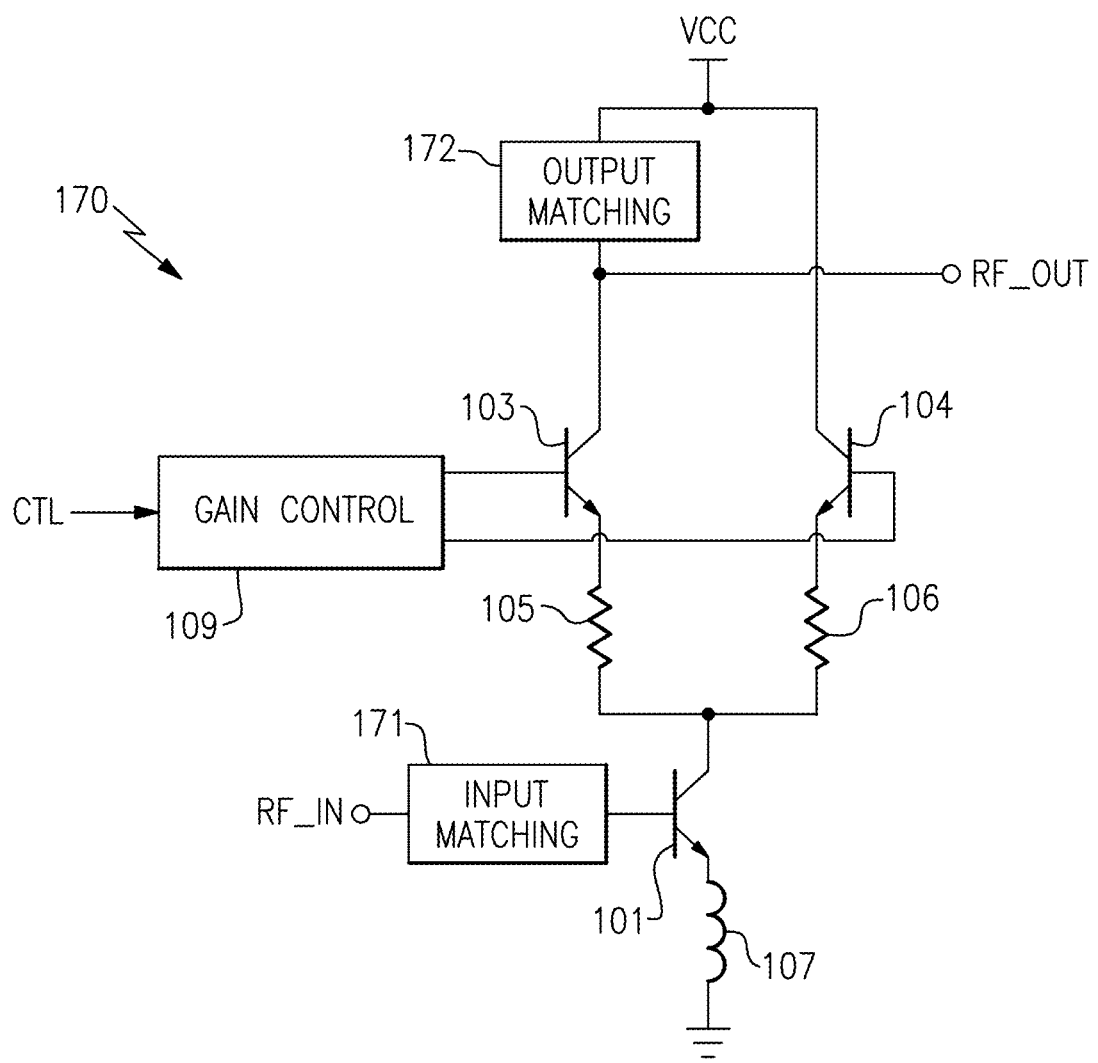
FIG. 8 is a schematic diagram of a VGA according to another embodiment.

FIG. 8 is a schematic diagram of a VGA 170 according to another embodiment. The VGA 170 of FIG. 8 is similar to the VGA 100 of FIG. 3, except that the VGA 100 further includes an input matching circuit 171. The input matching circuit 171 can include a variety of components, such as one or more inductors, one or more capacitors, and/or one or more resistors implemented to achieve desired input matching characteristics. Additionally, rather than including the output matching inductor 108, the VGA 170 of FIG. 8 includes an output matching circuit 172, which can include one or more components connected to provide desired output impedance matching characteristic and/or load line. For example, in certain implementations the output matching circuit 172 includes one or more inductors, one or more capacitors, and/or one or more resistors implemented to achieve desired output performance characteristics.

Figure 9:
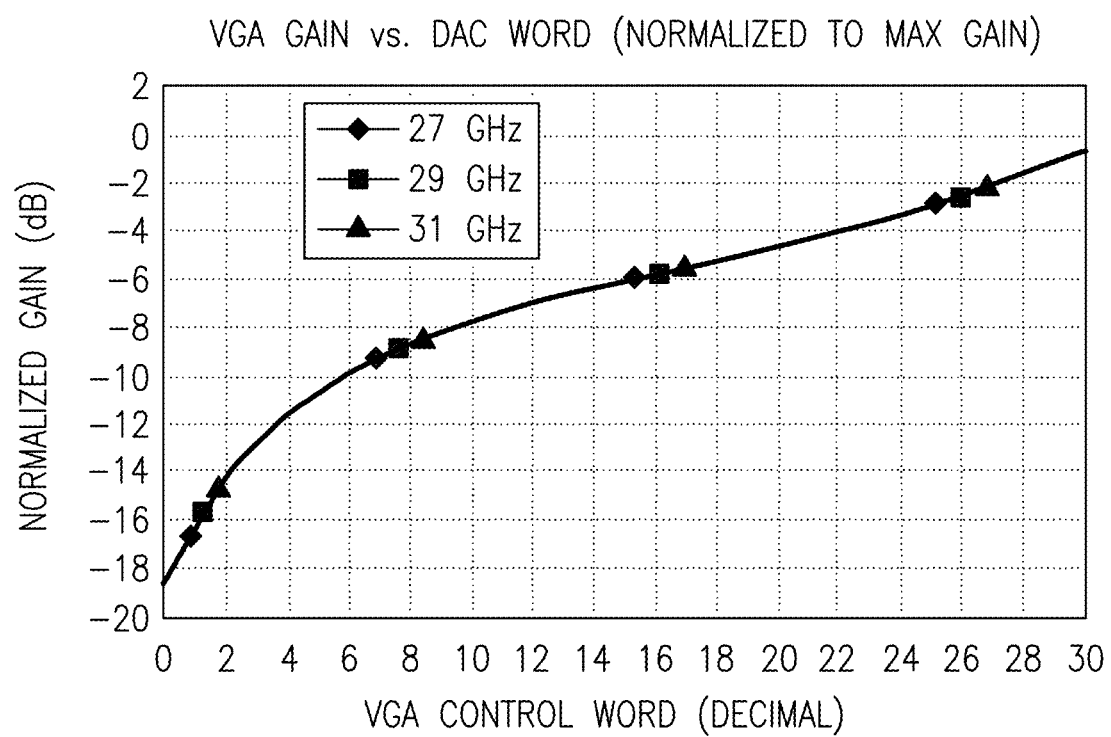
FIG. 9 is a graph of one example of normalized gain versus control word.
Figure 10:
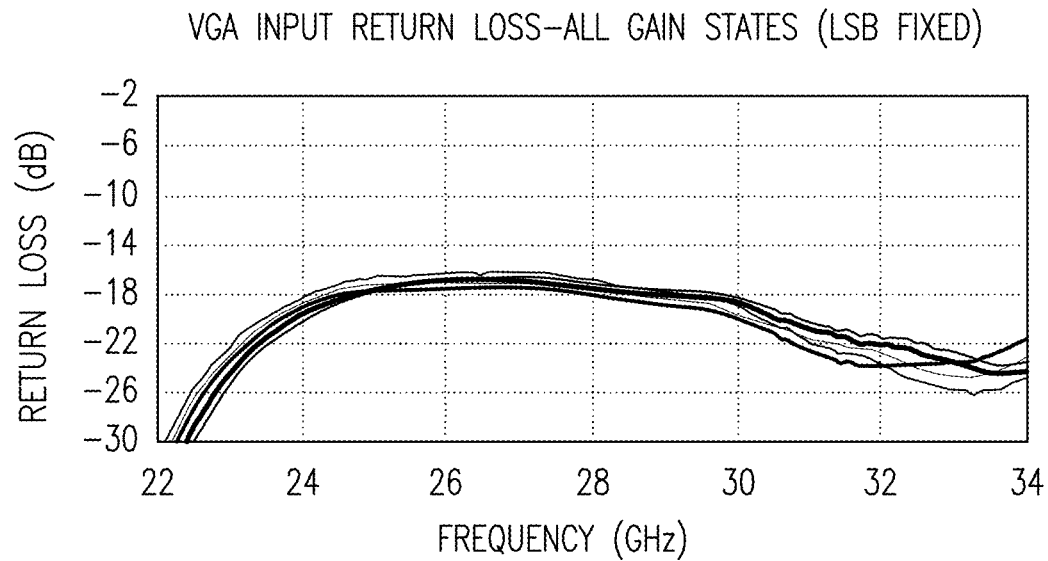
FIG. 10 is a graph of one example of input return loss versus frequency.
Figure 11:
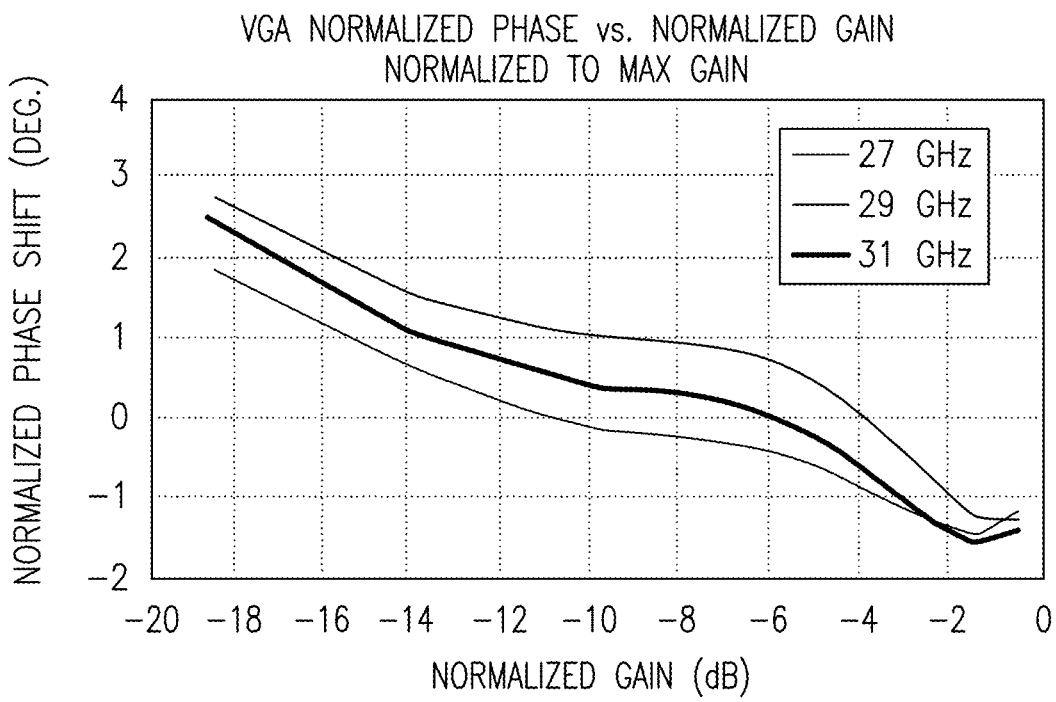
FIG. 11 is a graph of one example of normalized phase shift versus normalized gain.

FIGS. 9-11 illustrate various measurement results for an implementation of the VGA 120 of FIG. 4 with a 5-bit DAC and fabricated in a silicon process.

FIG. 9 is a graph of one example of normalized gain versus control word. The graph includes plots of gain versus control word at 27 gigahertz (GHz), 29 GHz, and 31 GHz. Although the gain across frequencies varies, the graph of FIG. 8 is normalized to show gain range characteristics. The plots are substantially overlapping, and thus the VGA exhibits good gain range characteristics across frequency. The VGA also exhibits good gain range across gain settings.

FIG. 10 is a graph of one example of input return loss versus frequency. The input return loss is provided for all gain states with least significant bit (LSB) fixed. As shown in FIG. 10, the VGA exhibits good input return loss characteristics across frequency and gain states. In the illustrated example, the VGA achieves input return loss of less than −15 dB over a gain range of 20 dB.

FIG. 11 is a graph of one example of normalized phase shift versus normalized gain. The graph includes plots of normalized phase shift versus normalized gain at 27 GHz, 29 GHz, and 31 GHz. As shown in FIG. 11, the VGA achieves less than 5 degrees of variation for a gain range of 20 dB.

Although various examples of performance results have been shown, simulation or measurement results can vary based on a wide variety of factors, such as simulation models, simulation tools, simulation parameters, measurement conditions, fabrication technology, and/or implementation details. Accordingly, other results are possible.

Applications

Devices employing the above described schemes can be implemented into various electronic devices. Examples of electronic devices include, but are not limited to, RF communication systems, consumer electronic products, electronic test equipment, communication infrastructure, etc. For instance, one or more VGAs can be included in a wide range of RF communication systems, including, but not limited to, radar systems, base stations, mobile devices (for instance, smartphones or handsets), phased array antenna systems, laptop computers, tablets, and/or wearable electronics.

The teachings herein are applicable to RF communication systems operating over a wide range of frequencies, including not only RF signals between 100 MHz and 7 GHz, but also to higher frequencies, such as those in the X band (about 7 GHz to 12 GHz), the $K_u$ band (about 12 GHz to 18 GHz), the K band (about 18 GHz to 27 GHz), the $K_a$ band (about 27 GHz to 40 GHz), the V band (about 40 GHz to 75 GHz), and/or the W band (about 75 GHz to 110 GHz). Accordingly, the teachings herein are applicable to a wide variety of RF communication systems, including microwave communication systems.

The signals amplified by the VGAs herein can be associated with a variety of communication standards, including, but not limited to, Global System for Mobile Communications (GSM), Enhanced Data Rates for GSM Evolution (EDGE), Code Division Multiple Access (CDMA), wideband CDMA (W-CDMA), 3G, Long Term Evolution (LTE), 4G, and/or 5G, as well as other proprietary and non-proprietary communications standards.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. A variable gain amplifier (VGA) with output phase invariance, the VGA comprising:
    a gain transistor configured to generate a signal current based on amplifying a radio frequency (RF) input signal received from an input terminal;
    a first degeneration resistor and a second degeneration resistor;
    an output cascode transistor electrically connected in series with the first degeneration resistor between an output terminal and the gain transistor;
    a shunt cascode transistor electrically connected in series with the second degeneration resistor between a DC voltage and the gain transistor;
    an output matching inductor connected between the output terminal and the DC voltage; and
    a gain control circuit configured to control a gain setting of the VGA by biasing the output cascode transistor with a first bias voltage and the shunt cascode transistor with a second bias voltage to control a proportion of the signal current that flows through the output cascode transistor relative to the shunt cascode transistor, wherein the first degeneration resistor and the second degeneration resistor are configured to provide the output phase invariance at the output terminal by providing a zero in a transfer function of the VGA to compensate for a pole in the transfer function arising from the output cascode transistor and the shunt cascode transistor.

2. The VGA of claim 1, wherein the gain setting is selected from a plurality of gain settings, wherein a bias current of the gain transistor is substantially constant across the plurality of gain settings.

3. The VGA of claim 2, wherein an input impedance at the input terminal substantially constant across the plurality of gain settings.

4. The VGA of claim 2, further comprising a current mirror configured to bias the gain transistor.

5. The VGA of claim 1, further comprising a degeneration inductor electrically connected between the gain transistor and ground.

6. The VGA of claim 1, wherein the gain setting is selected from a plurality of gain settings, wherein the gain control circuit comprises a predistorter circuit configured to provide linearization across the plurality of gain settings.

7. The VGA of claim 1, further comprising a plurality of pairs of transistors selectively activated by the gain control circuit based on the gain setting, wherein a first pair of the plurality of pairs of transistors corresponds to the output cascode transistor and the shunt cascode transistor.

8. The VGA of claim 7, wherein the plurality of pairs of transistors are weighted.

9. The VGA of claim 1, wherein the gain transistor, the output cascode transistor, and the shunt cascode transistor are implemented as bipolar transistors.

10. The VGA of claim 1, wherein the gain transistor, the output cascode transistor, and the shunt cascode transistor are implemented as field-effect transistors.

11. A radio frequency (RF) system comprising:
a controllable phase shifter; and
a VGA electrically connected in a signal path with the controllable phase shifter, wherein the VGA comprises a gain transistor configured to amplify an RF signal received from an input terminal, a first degeneration resistor and a second degeneration resistor, an output cascode transistor electrically connected in series with the first degeneration resistor between an output terminal and the gain transistor, an output matching inductor connected between the output terminal and the DC voltage, a shunt cascode transistor electrically connected in series with the second degeneration resistor between a DC voltage and the gain transistor, and a gain control circuit configured to control a gain setting of the VGA by biasing the output cascode transistor with a first bias voltage and the shunt cascode transistor with a second bias voltage, wherein the first degeneration resistor and the second degeneration resistor are configured to provide output phase invariance at the output terminal by providing a zero in a transfer function of the VGA to compensate for a pole in the transfer function arising from the output cascode transistor and the shunt cascode transistor.

12. The radio frequency system of claim 11 further comprising an antenna and a low noise amplifier coupled to the antenna, wherein the low noise amplifier is configured to provide an amplified RF signal to the controllable phase shifter, and wherein the controllable phase shifter is configured to provide a phase-shifted RF signal to the VGA.

13. The radio frequency system of claim 11, further comprising an antenna and a power amplifier coupled to the antenna, wherein the VGA is configured to provide an amplified RF signal to the controllable phase shifter, and wherein the controllable phase shifter is configured to provide a phase-shifted RF signal to the power amplifier.

14. The radio frequency system of claim 11, wherein an output phase of the VGA changes by less than about 5 degrees over a gain range of at least 20 dB.

15. A method of variable gain amplification, the method comprising:
amplifying a radio frequency (RF) input signal from an input terminal to generate a signal current using a gain transistor of a variable gain amplifier (VGA);
controlling a gain setting of the VGA by biasing an output cascode transistor of the VGA with a first bias voltage and a shunt cascode transistor of the VGA with a second bias voltage to control a proportion of the signal current that flows through the output cascode transistor relative to the shunt cascode transistor;
flowing a first portion of the signal current from the gain transistor to a DC voltage through a series combination of a first degeneration resistor of the VGA, the output cascode transistor, and an output matching inductor of the VGA;
flowing a second portion of the signal current from the gain transistor to the DC voltage through a series combination of a second degeneration resistor of the VGA and the shunt cascode transistor;
providing an RF output signal at an output terminal between the output cascode transistor and the output matching inductor; and
providing output phase invariance at the output terminal by using the first degeneration resistor and the second degeneration resistor to provide a zero in a transfer function of the VGA to compensate for a pole in the transfer function arising from the output cascode transistor and the shunt cascode transistor.

16. The method of claim 15 further comprising choosing the gain setting from a plurality of gain settings that provide a gain range of at least 20 dB.

17. The method of claim 16 further comprising limiting a variation in output phase at the output terminal to be less than 5 degrees over the gain range.

18. The method of claim 16 further comprising biasing the gain transistor with a bias current that is substantially across the plurality of gain settings.

19. The method of claim 16 further comprising limiting an input return loss at the input terminal to be less than 15 dB over the gain range.

20. The method of claim 16 further comprising maintaining a substantially constant input impedance at the input terminal across the plurality of gain settings.

* * * * *